United States Patent
Ueda et al.

(10) Patent No.: US 6,829,274 B2
(45) Date of Patent: Dec. 7, 2004

(54) SURFACE EMITTING SEMICONDUCTOR LASER DEVICE

(75) Inventors: Natsumi Ueda, Tokyo (JP); Noriyuki Yokouchi, Tokyo (JP); Tatsuyuki Shinagawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/214,787

(22) Filed: Aug. 6, 2002

(65) Prior Publication Data

US 2003/0043871 A1 Mar. 6, 2003

(30) Foreign Application Priority Data

Aug. 13, 2001 (JP) ....................................... 2001-245171
Mar. 28, 2002 (JP) ....................................... 2002-052820

(51) Int. Cl.[7] ................................................ H01S 5/00
(52) U.S. Cl. ............................................. 372/45; 372/46
(58) Field of Search ...................................... 372/45–46

(56) References Cited

U.S. PATENT DOCUMENTS 5,825,796 A * 10/1998 Jewell et al. .................. 372/45
6,396,865 B1 * 5/2002 Mawst et al. .................. 372/45

* cited by examiner

*Primary Examiner*—Tan Ho
*Assistant Examiner*—James Menefee
(74) *Attorney, Agent, or Firm*—Oblon, Spivak, McClelland, Maier & Neustadt, P.C.

(57) ABSTRACT

A surface emitting semiconductor laser device of oxidized-Al current confinement structure has a resonant wavelength of a fundamental transverse mode, which is set shorter than or equal to a peak-gain wavelength of the laser device at a specified temperature. The surface emitting semiconductor laser device emits in a single-transverse mode.

4 Claims, 7 Drawing Sheets

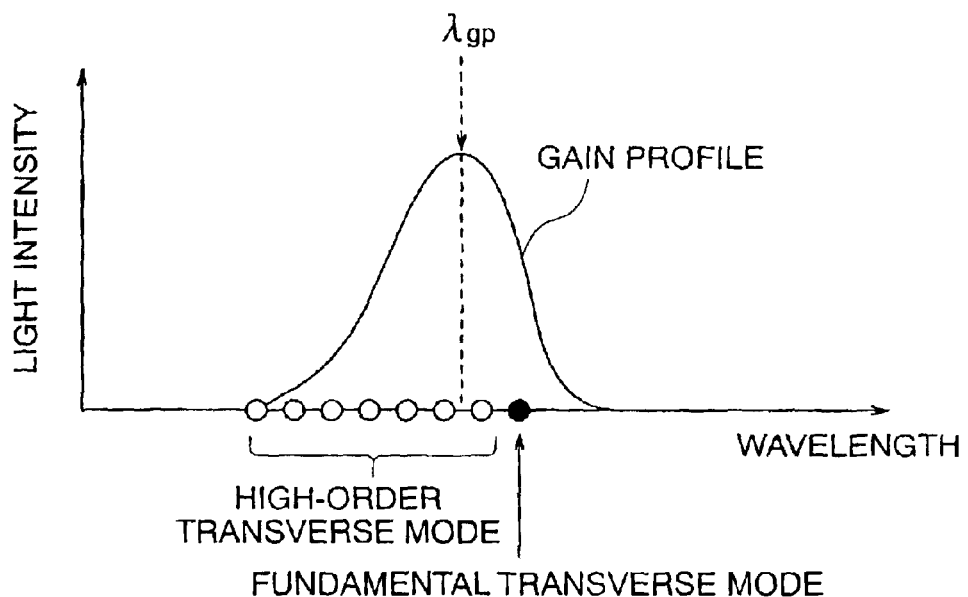
FIG. 3A
CONVENTIONAL
INVENTION

SURFACE EMITTING SEMICONDUCTOR LASER DEVICE

BACKGROUND OF THE INVENTION

1. Field of the Invention

The present invention relates to a surface emitting semiconductor laser device (hereinafter referred to as surface emitting laser device) and, more particularly to a vertical-cavity surface emitting laser device that emits in a single transverse mode with excellent stability and is suited as a light source for use in the field of optical data transmission and optical communication.

2. Description of the Related Art

The surface emitting laser device, which emits laser light in a direction perpendicular to the substrate surface, attracts attention as a light source for use in the data communication field these days. One of the reasons for the attention is that a plurality of surface emitting laser devices can be arranged in a two-dimensional array on the same substrate, unlike the Fabry-Perot resonant cavity semiconductor laser device.

The surface emitting laser device has a pair of semiconductor multilayer reflectors (distributed Bragg reflector: DBR) each including $Al_xGa_{(1-x)}As/Al_yGa_{(1-y)}As$ layer pairs (where x and y for the molecular ratio of GaAs and AlAs satisfy 0y<x1), which overlie a semiconductor substrate made of GaAs or InP. The surface emitting laser device has between the pair of reflectors a vertical resonant cavity including an active layer structure and emits laser light in the direction perpendicular to the substrate surface.

In particular, the GaAs-group surface emitting laser device can employ DBRs including AlGaAs layers, which well lattice match with the GaAs substrate and have an excellent thermal conductivity and a higher reflectivity, and thus is expected for use as a laser device having an emission wavelength of 0.8 $\mu$m to 1.0 $\mu$m.

There is a current confinement structure available for the surface emitting laser device, in which a narrowed current injection area is provided to increase the current efficiency and decrease the threshold current of the laser device. The current confinement structure is categorized in two types: a current confinement structure having an ion-implanted p-n junction and an oxidized-Al current confinement structure. In the oxidized-Al current confinement structure, for example, the Al component in an AlAs or AlGaAs layer is selectively oxidized to have a peripheral oxidized-Al area and a central non-oxidized area, the latter constituting the current injection area. The oxidized-Al current confinement structure has an excellent current confinement function and can be fabricated relatively easily, whereby the oxidized-Al current confinement structure is widely used in the surface emitting laser device.

FIG. 1 is a perspective view illustrating the configuration of a GaAs-group surface emitting laser device having an oxidized-Al current confinement structure.

The surface emitting laser device 10 of FIG. 1 has a layer structure including an n-type lower DBR 14, a vertical resonant cavity 16, a p-type upper DBR 18, and a 10 nm-thick p-GaAs cap layer 20, which are deposited on an n-GaAs substrate 12.

The n-type lower DBR 14 is formed in a multi-layer reflector structure having 35 n-type $Al_{0.2}Ga_{0.8}As/Al_{0.9}Ga_{0.1}As$ layer pairs.

The resonant cavity 16 includes an undoped $Al_{0.3}Ga_{0.7}As$ lower cladding layer 16a, a $GaAs/Al_{0.2}Ga_{0.8}As$ multi-quantum-well (MQW) active layer structure 16b, and an undoped $Al_{0.3}Ga_{0.7}As$ upper cladding layer 16c.

The p-type upper DBR 18 is formed in a multi-layer reflector structure having 20.5 p-type $Al_{0.2}Ga_{0.8}As/Al_{0.9}Ga_{0.1}As$ layer pairs, with the bottom $Al_{0.9}Ga_{0.1}As$ layer being replaced by a 50 nm-thick AlAs layer 24 to implement a current confinement structure.

In addition, the p-type cap layer 20, the p-type upper DBR 18, the resonant cavity 16, and the upper layers of the n-type lower DBR 14 are configured by etching to a mesa post 22.

For the current confinements structure, the AlAs layer 24 formed as the bottom layer of the p-type upper DBR 18 is selectively oxidized with steam at a high temperature from the periphery of the mesa post 22, thereby forming an annular oxidized-Al area 24B. The non-oxidized central area 24A of the AlAs layer 24 surrounded by the oxidized-Al area 24B serves as a current injection area.

A SiNx passivation film 26 is formed on the side-wall of the mesa post 22 and the n-type lower DBR 14 outside the mesa post 22. A polyimide layer 28 embeds the periphery of the mesa post 22 for achieving planarization, as well as for raising the thermal conductivity, reducing the parasitic capacitance, and improving the operating speed.

On top of the mesa post 22, there is provided an annular p-side electrode 30 in electric contact with the p-GaAs cap layer 20, whereas an n-side electrode 32 is provided on the bottom surface of the n-GaAs substrate 12.

FIGS. 2A to 2F depict the conventional surface emitting laser device of FIG. 1 during consecutive steps of fabrication thereof.

First, the n-GaAs substrate 12 is subjected to an acid treatment to clean the substrate surface, and then introduced into a MOCVD system, wherein 35 n-type $Al_{0.2}Ga_{0.8}As/Al_{0.9}Ga_{0.1}As$ layer pairs are deposited by an epitaxial growth technique to form the n-type lower DBR 14 on the n-GaAs substrate 12. On the bottom layer of the p-type upper DBR 18, the 50 nm-thick AlAs film 25 is formed instead of the $Al_{0.9}Ga_{0.1}As$ film.

Subsequently, the undoped $Al_{0.3}Ga_{0.7}As$ cladding layer 16a, the $GaAs/Al_{0.2}Ga_{0.8}As$ MQW active layer structure 16b, and the undoped $Al_{0.3}Ga_{0.7}As$ cladding layer 16c are epitaxially deposited.

Thereafter, 20.5 p-type $Al_{0.2}Ga_{0.8}As/Al_{0.9}Ga_{0.1}As$ layer pairs are stacked to form the p-type upper DBR 18, followed by epitaxial growth of the p-GaAs cap layer 20, thereby forming the layer structure as shown in FIG. 2A.

Subsequently, using a plasma CVD system, a SiNx film 33 is deposited on the p-GaAs cap layer 20. Further, a resist film (not shown) is deposited on the SiNx film 33, and then patterned by photolithography to form a resist mask 34 having a diameter of about 40 $\mu$m, as shown in FIG. 2B.

After the resist mask 34 is formed, the SiNx film 33 is etched by reactive ion etching (RIE) using a $CF_4$ gas as an etching gas and the resist mask 34 as an etching mask. Then, the p-type cap layer 20, the p-type upper DBR 18, the resonant cavity 16, and the top portion of the n-type lower DBR 14 are etched by a reactive ion beam etching (RIBE) system using a chlorine gas as an etching gas, to form a cylindrical mesa post 22, as shown in FIG. 2C.

After the etching is completed, the resist mask 34 is removed. Subsequently, the layer structure shown in FIG. 3C is subjected to a so-called wet oxidation treatment for about 25 minutes in a steam ambient at a temperature of 400.

As shown in FIG. 2D, the wet oxidation treatment causes the Al component in the AlAs layer 25 on the bottom of the p-type upper DBR 18 to be oxidized into $Al_2O_3$ from the outer periphery of the mesa post 22, thereby forming the oxidized-Al area 24B as a current confinement area at the bottom portion of the mesa post 22.

On the other hand, the central area of the AlAs layer 24 left as the non-oxidized area 24A serves as a current injection area. The current injection area 24A surrounded by the oxidized-Al area 24B is 5 μm in diameter.

After the wet oxidation treatment is completed, the SiNx film 33 is removed by RIE.

Then, as shown in FIG. 2E, using a plasma CVD technique, the SiNx passivation film 26 is deposited on the top and side-wall of the mesa post 22 and on the n-type lower DBR 14 outside the mesa post 22.

The polyimide layer 28 is then formed on the SiNx passivation film 26 to bury the mesa post 22. Subsequently, by using a photolithographic technique, a portion of the polyimide layer 28 formed on top of the mesa post 22 is removed to expose the SiNx passivation film 26, as shown in FIG. 2E.

Thereafter, by a RIE technique using a $CF_4$ gas as an etching gas, the SiNx passivation film 26 exposed on top of the mesa post 22 is selectively etched to form a window having a diameter of 30 μm. Further, the annular p-side electrode 30 in electric contact with the p-type cap layer 20 is formed on the passivation film 26 by evaporation of AuZn, as shown in FIG. 2F.

After the p-side electrode 30 is formed, the bottom surface of the n-GaAs substrate 12 is polished to adjust the thickness of the substrate at 200 μm. Then, an AuGeNi film is evaporated onto the bottom surface of the n-GaAs substrate to form the n-side electrode 32.

After the process as described above, a dicing saw is used for dicing the wafer mounting thereon a plurality of laser devices into a plurality of chips each including a laser device 10 as shown in FIG. 1.

In general, semiconductor laser devices used as light sources in the optical data transmission field emit laser in a single mode or a multimode.

A laser beam emitted in a single mode can transmit data at a higher speed compared to a laser beam emitted in a multimode. It is therefore desirable for the surface emitting laser device used as a light source in an optical data transmission system to emit either in a single-longitudinal mode or in a single-transverse mode.

The surface emitting laser device having the oxidized-Al current confinement structure inherently emits in a single-longitudinal mode due to the structure thereof. On the other hand, the difference in the refractive index between the non-oxidized area 24A as a current injection area and the oxidized-Al area 24 as a current confinement area may cause the surface emitting laser device to lase in a transverse mode. In addition, depending on the structure of the laser device, the lasing in the transverse mode may be sometimes a multimode lasing including a fundamental mode lasing and a higher-order mode lasing.

To implement the single-transverse mode lasing in the surface emitting laser device, the current injection area has typically a small area having a diameter of as small as 5 μm in order to cut off the higher-order transverse mode lasings other than the fundamental transverse mode lasing.

However, there is a problem in the conventional method for forming the oxidized-Al current confinement structure, in which the Al component is selectively oxidized inwardly from the periphery of the mesa post to form the annular oxidized-Al area. That is, since it is difficult to precisely control the width of the oxidized-Al area of the current injection area in the conventional technique, higher-order transverse mode lasings other than the fundamental transverse mode lasing could not be necessarily removed as desired.

Consequently, the conventional surface emitting laser device having the oxidized-Al current confinement structure may lase in higher-order transverse modes, thereby making it difficult to lase in a single-transverse mode with high stability.

SUMMARY OF THE INVENTION

It is therefore an object of the present invention to provide a surface emitting laser device that lases in a single fundamental transverse mode with higher stability.

The present invention is directed to a surface emitting laser device having an oxidized-Al current confinement structure, formed on a substrate, and having a pair of semiconductor multilayer reflectors and a resonant cavity including an active layer disposed between the pair of semiconductor multilayer reflectors. The surface emitting laser device emits laser beams in a direction perpendicular to the substrate surface, wherein the cavity length is set in accordance with the relationship between the emission wavelength of the fundamental transverse mode of the laser device and the cavity length thereof at a predetermined temperature so that the resonant wavelength of the fundamental transverse mode is shorter than or equal to the peak-gain wavelength at a predetermined temperature, thereby allowing the fundamental transverse mode to have a maximum gain In accordance with the surface emitting laser device of the present invention, it is possible to prevent emission in higher-order transverse modes, thereby allowing the surface emitting laser device to emit in a single fundamental transverse mode with higher stability.

To allow the resonant wavelength of the fundamental transverse mode to be shorter than or equal to the peak-gain wavelength at the predetermined temperature, for example, the cavity length is set so that the resonant wavelength of the fundamental transverse mode is shorter than or equal to the peak-gain wavelength at the predetermined temperature, in accordance with the relationship between the resonant wavelength of the fundamental transverse mode and the cavity length.

The above and other objects, features and advantages of the present invention will be more apparent from the following description, referring to the accompanying drawings.

BRIEF DESCRIPTION OF THE DRAWINGS

FIGS. 3A and 3B are graphs showing the gain profiles of the conventional surface emitting laser device and a surface emitting laser device according to an embodiment of the present invention, respectively;

DETAILED DESCRIPTION OF THE PREFERRED EMBODIMENTS

Before describing preferred embodiment of the present invention, the principle of the present invention will be described for a better understanding of the present invention.

In general, a laser beam emitted in a higher-order transverse mode is shorter in wavelength compared to the laser beam emitted in the fundamental transverse mode. This is more specifically described below with reference to FIGS. 3A and 3B, which show the gain distributions of the conventional surface emitting laser device and a surface emitting laser device according to an embodiment of the present invention, respectively.

The inventor conceived the idea of preventing the higher-order transverse modes by taking advantage of this property of the higher-order transverse mode having a shorter wavelength, to provide a maximum gain to the fundamental transverse mode and suppress the higher-order mode lasing.

The surface emitting laser device lases in a single-longitudinal mode that is determined by the cavity length defined by a pair of multilayer reflectors. For this longitudinal mode, there exist a plurality of transverse modes that are based on the difference in refractive index between the non-oxidized area and the oxidized-Al area.

Figure 1:
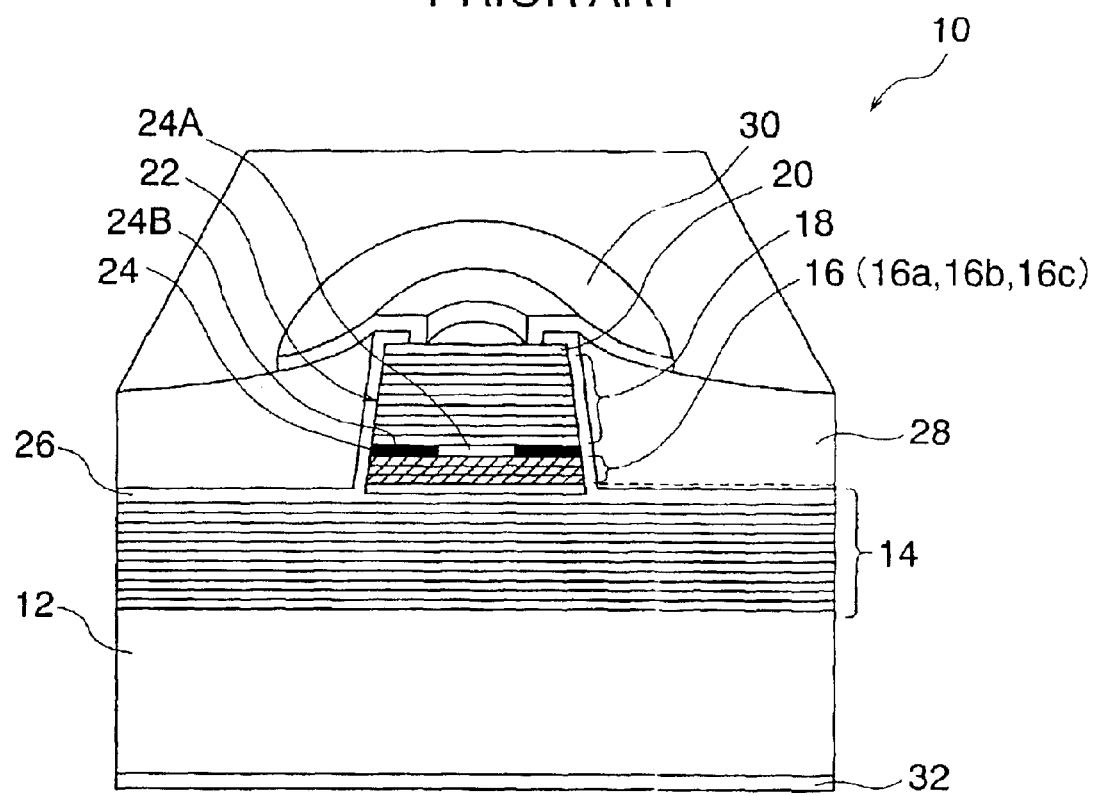
FIG. 1 is a partially-cutout perspective view illustrating the configuration of a conventional surface emitting laser device.
Figure 2A:
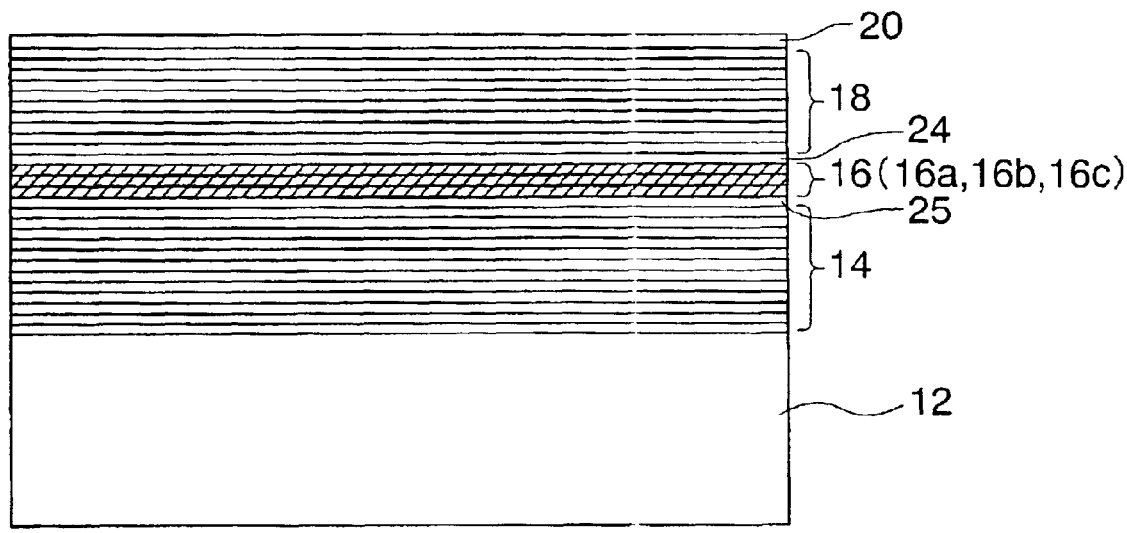
FIGS. 2A to 2F are sectional views illustrating consecutive steps of a method for fabricating the conventional surface emitting laser device of FIG. 1.
Figure 2B:
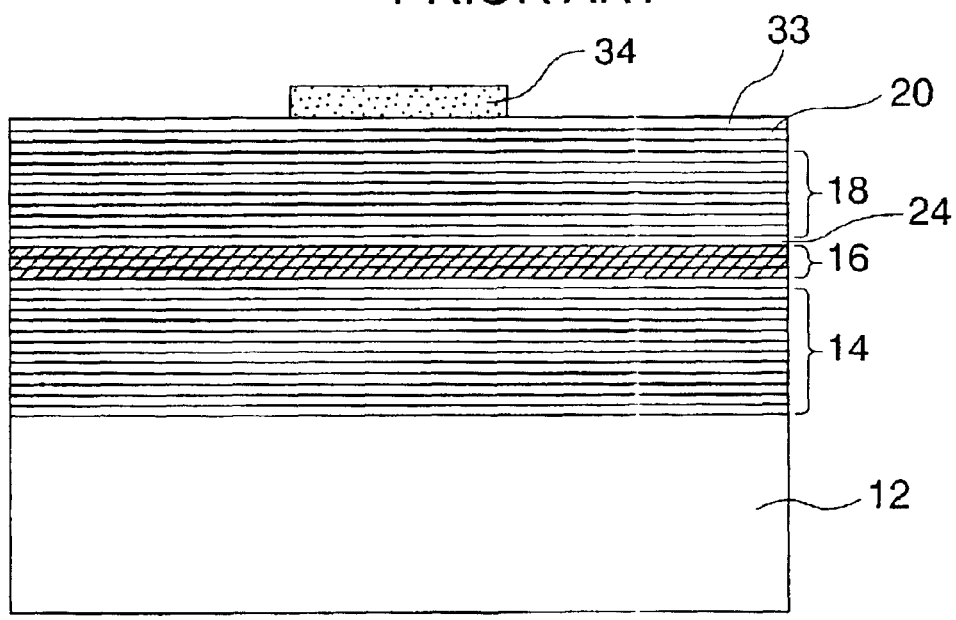
Figure 2C:
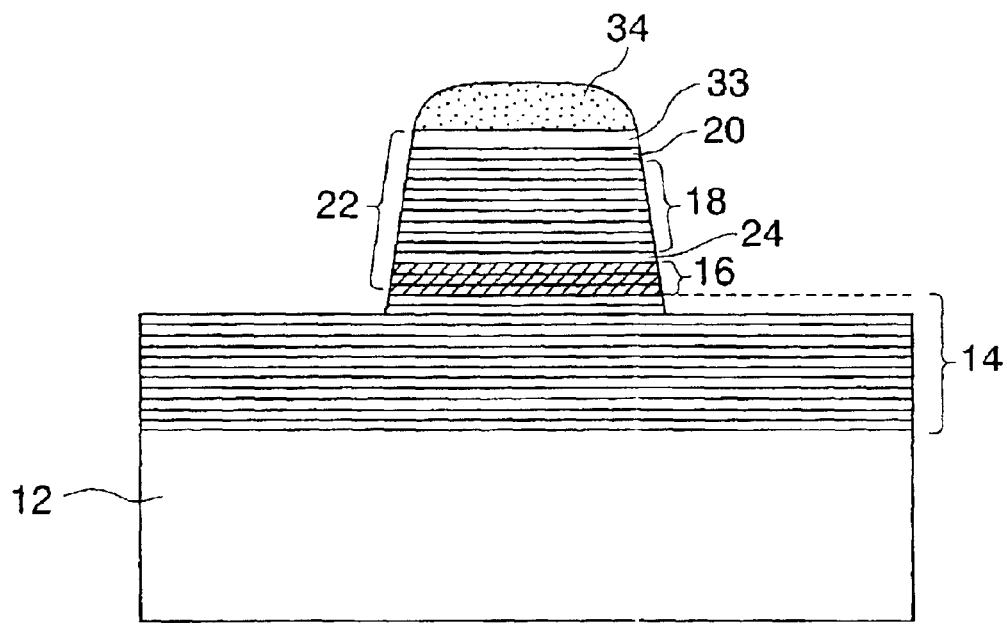
Figure 2D:
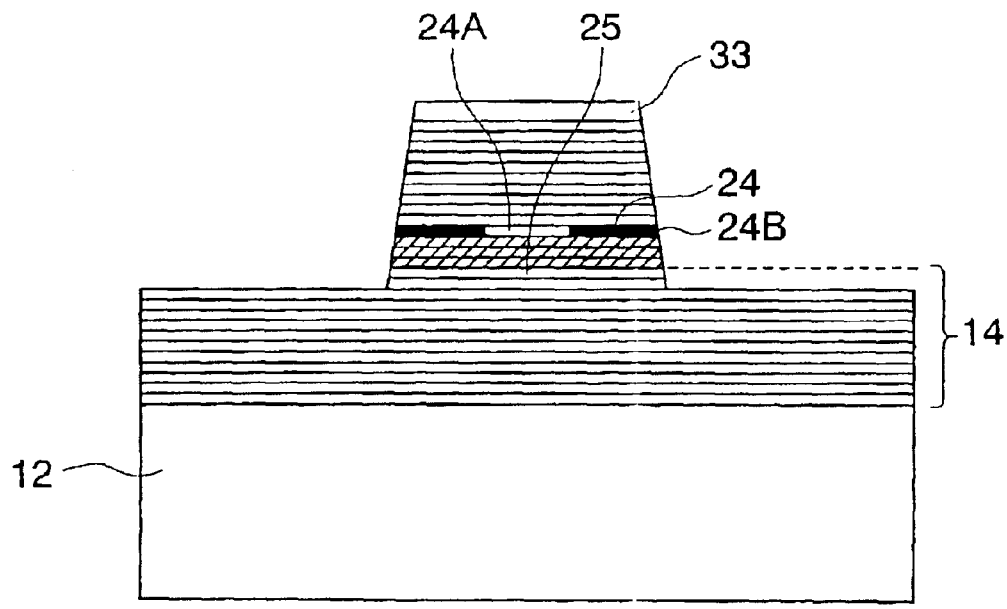
Figure 2E:
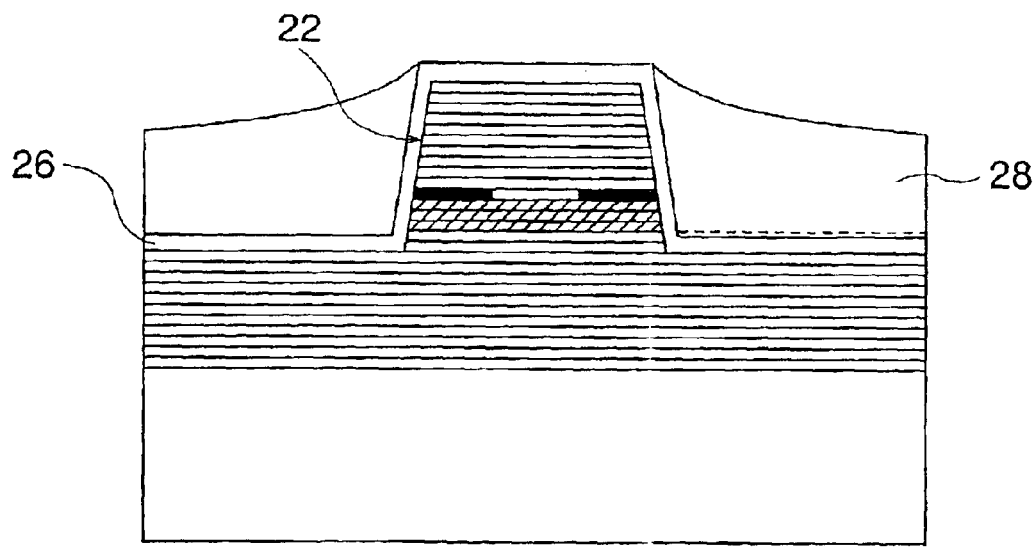
Figure 2F:
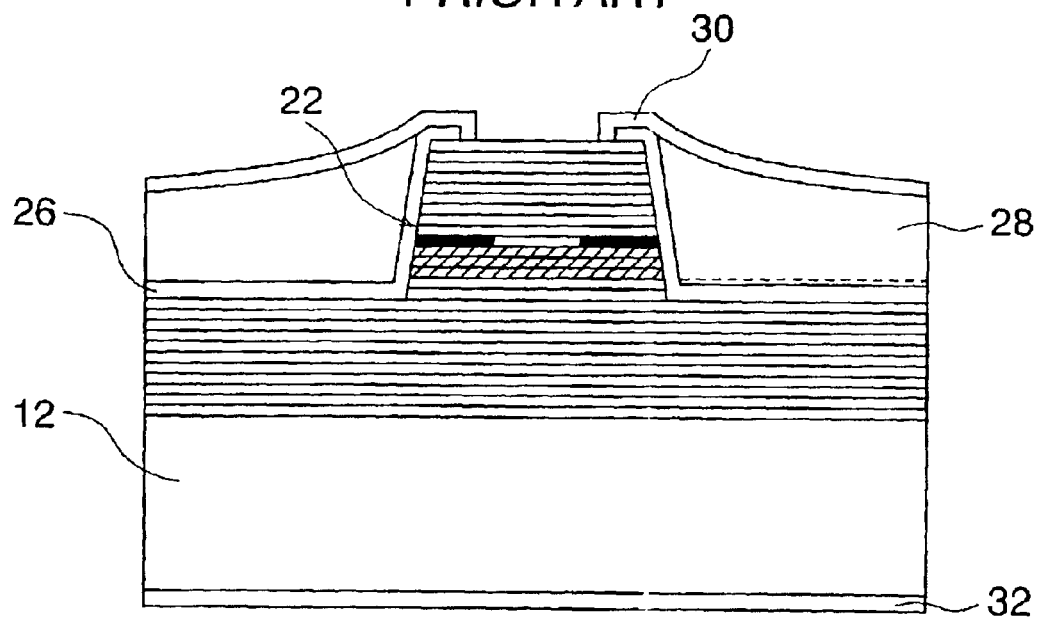
Figure 3B:
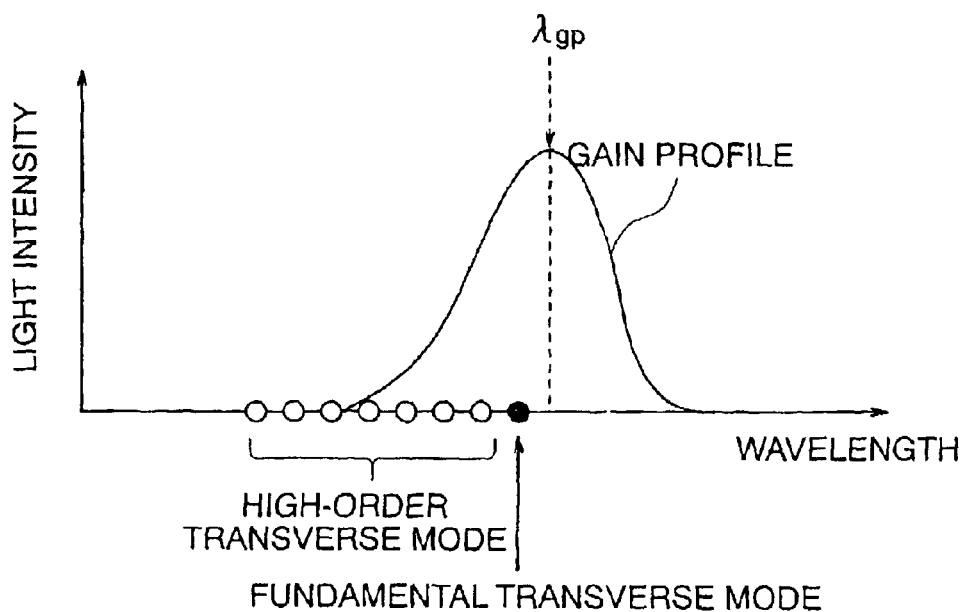

As shown in FIGS. 3A and 3B, these transverse modes have resonant wavelengths that are slightly different from one another. Higher-order transverse modes have shorter wavelengths, and the fundamental transverse mode has the longest wavelength. On the other hand, the gain indicative of the degree of light amplification in the active layer resides within the range of wavelength that is determined by the bandgap energy of the material of the active layer.

Assuming that the peak wavelength of the gain distribution of the active layer is $\lambda_{gp}$, the conventional surface emitting laser device has a resonant wavelength for the fundamental transverse mode which is longer than $\lambda_{gp}$, as shown in FIG. 3A.

On the other hand, as shown in FIG. 3B, in the present invention, the thickness of the active layer is set in accordance with the relationship between the resonant wavelength of the fundamental transverse mode and the cavity length at a predetermined temperature so that $\lambda_{gp}$ is longer than or equal to the resonant wavelength of the fundamental transverse mode.

From the reason that the higher-order modes are shorter than or equal to the fundamental mode in wavelength, it is derived that the fundamental transverse mode has a higher gain and the higher-order transverse modes have lower gains, thereby making it difficult for the surface emitting laser device to lase in higher-order transverse modes.

Since $\lambda_{gp}$ is subjected to variations in the ambient temperature, the thickness of the active layer should be set so as to meet the above conditions at an actual service temperature.

Thus, the present invention defines that the resonant wavelength of the fundamental transverse mode be set shorter than or equal to the peak-gain wavelength at a predetermined temperature.

To make the resonant wavelength of the fundamental transverse mode shorter than or equal to the peak-gain wavelength at the predetermined temperature, for example, the cavity length is set such that the resonant wavelength of the fundamental transverse mode is shorter than or equal to the peak-gain wavelength at the predetermined temperature, in accordance with the relationship between the resonant wavelength of the fundamental transverse mode and the cavity length.

In a preferred embodiment of the present invention, the cavity length is set such that the resonant wavelength of the fundamental transverse mode is shorter than or equal to the peak-gain wavelength at a predetermined temperature. This is obtained in accordance with the relationship between the peak emission wavelength determined by photoluminescence and the thickness of the active layer, and the relationship between the peak emission wavelength and the peak-gain wavelength in addition to the relationship between the resonant wavelength of the fundamental transverse mode and the cavity length.

As referred to in the invention, "the relationship between the resonant wavelength of the fundamental transverse mode and the cavity length" is such that the cavity length is equal to the ratio of the resonant wavelength of the fundamental transverse mode to the refractive index. The relationship between the peak emission wavelength and the thickness of the active layer is defined by the energy levels of electrons and holes that are formed in the quantum well of the active layer structure. The relationship between the peak emission wavelength and the peak-gain wavelength is inherent to materials, depends on the exciting level, and can be determined by experiments.

It is to be noted that the resonant wavelength is determined by measuring the spectroscopic reflectivity of the epitaxial wafer on which the layer structure of the surface emitting laser device is formed. The predetermined temperature is typically an operating temperature of the surface emitting laser device.

The surface emitting laser device of the present invention is applicable regardless of the length of the peak-gain wavelength. Accordingly, for example, the laser device of the present invention is applicable to those in a GaAs group, an AlGaAs group, InP group, or GaInNAs group, independently of the compositions of the substrate, the multilayer reflectors, the cladding layers, and the active layer or layers.

Now, the present invention will be more specifically described below in accordance with an embodiment thereof.

A surface emitting laser device according to an embodiment of the present invention is similar to the conventional surface emitting laser device in configuration and in the fabrication process thereof except that the resonant wavelength of the fundamental transverse mode is shorter than or equal to the peak-gain wavelength at a predetermined temperature.

In this embodiment, to allow the resonant wavelength of the fundamental transverse mode to be shorter than or equal to the peak-gain wavelength at a predetermined temperature, the cavity length is set such that the resonant wavelength assumes 848 nm in accordance with the predetermined relationship between the resonant wavelength of the cavity length $d_{cav}$. In this configuration, the cavity length is the thickness of the resonant cavity 16, or the total thickness $d_{cav}$ of the lower cladding layer, the quantum well, and the upper cladding layer.

In the foregoing, the relationship between the resonant wavelength $\lambda$ and the cavity length $d_{cav}$ is expressed by $d_{cav}=\lambda/n$, where "n" is the refractive index of the material $Al_{0.3}Ga_{0.7}As$ of the upper and lower cladding layers.

The resonant wavelength is determined by measuring the spectroscopic reflectivity of the epitaxial wafer, on which the layer structure constituting the surface emitting laser device is formed. On the other hand, assuming that the peak emission wavelength determined by photoluminescence is $\lambda_{PL}$, the thickness $d_w$ of the GaAs layer of the quantum well is set so that $\lambda_{PL}=840$ nm in accordance with the relationship between the predetermined $\lambda_{PL}$ and $d_w$.

From the relationship between the peak emission wavelength $\lambda_{PL}$ and the peak-gain wavelength, the peak-gain wavelength provided by injection current is approximately 850 nm.

Figure 4:
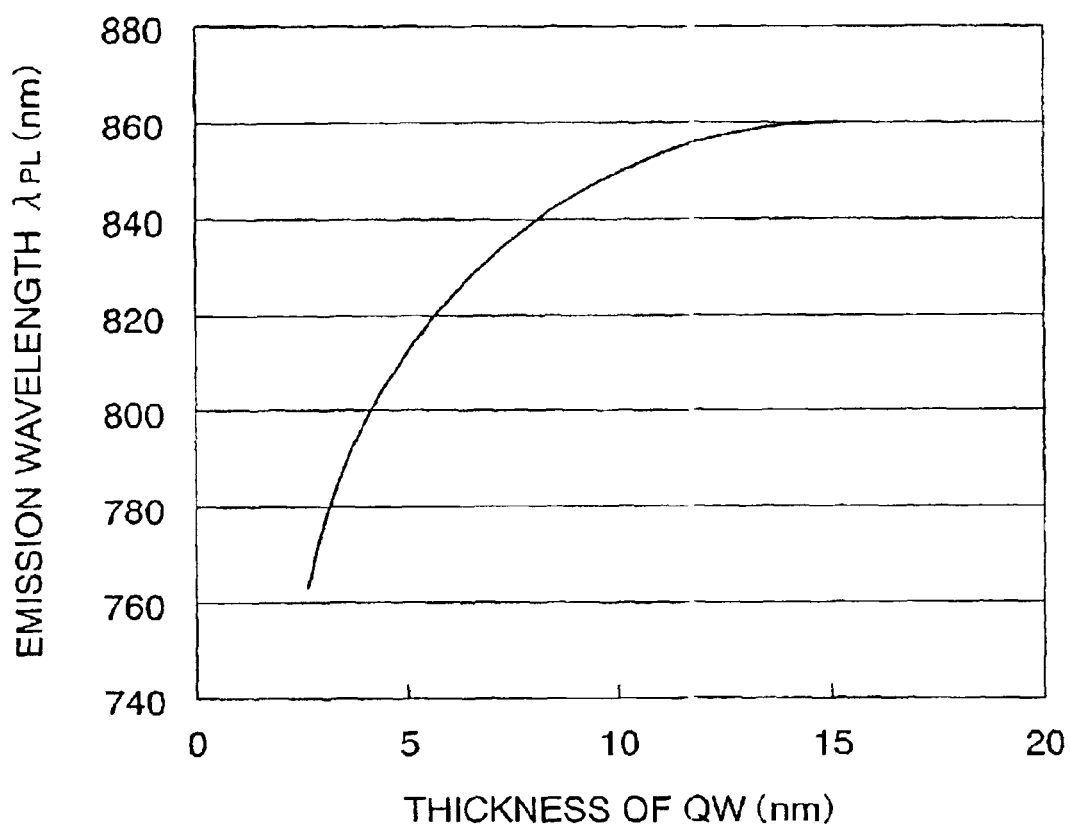
FIG. 4 is a graph showing the relationship between the thickness of a quantum well (nm) and the emission wavelength $\lambda_{PL}$ of the surface emitting laser device.

The relationship between the peak emission wavelength $\lambda_{PL}$ and the thickness $d_w$ of the quantum well is as shown in FIG. 4. The relationship between the peak emission wavelength $\lambda_{PL}$ and the peak-gain wavelength can be obtained by fabricating an edge emitting laser device having an elongated resonant cavity on the epitaxial wafer and by allowing the edge emitting laser device to lase.

Figure 5A:
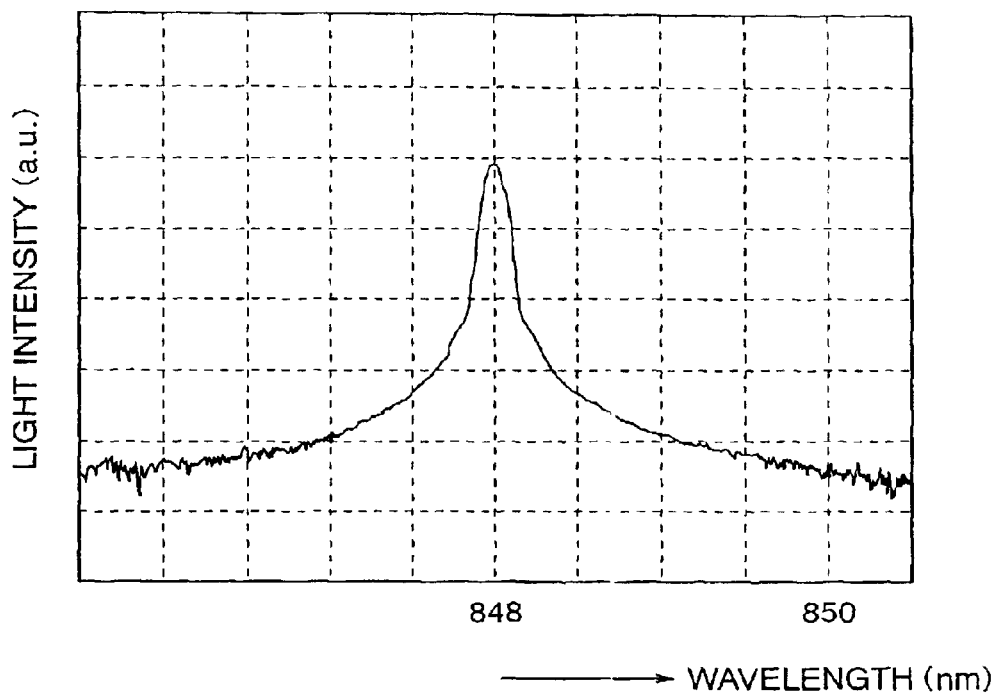
FIGS. 5A and 5B are graphs showing the spectrum of the surface emitting laser device of the embodiment and the conventional surface emitting laser device.

As shown in FIG. 5A, by measuring the lasing spectrum of the surface emitting laser device according to this embodiment, it is confirmed that the surface emitting laser device lased in a single transverse mode at a single peak of 848 nm.

Figure 5B:
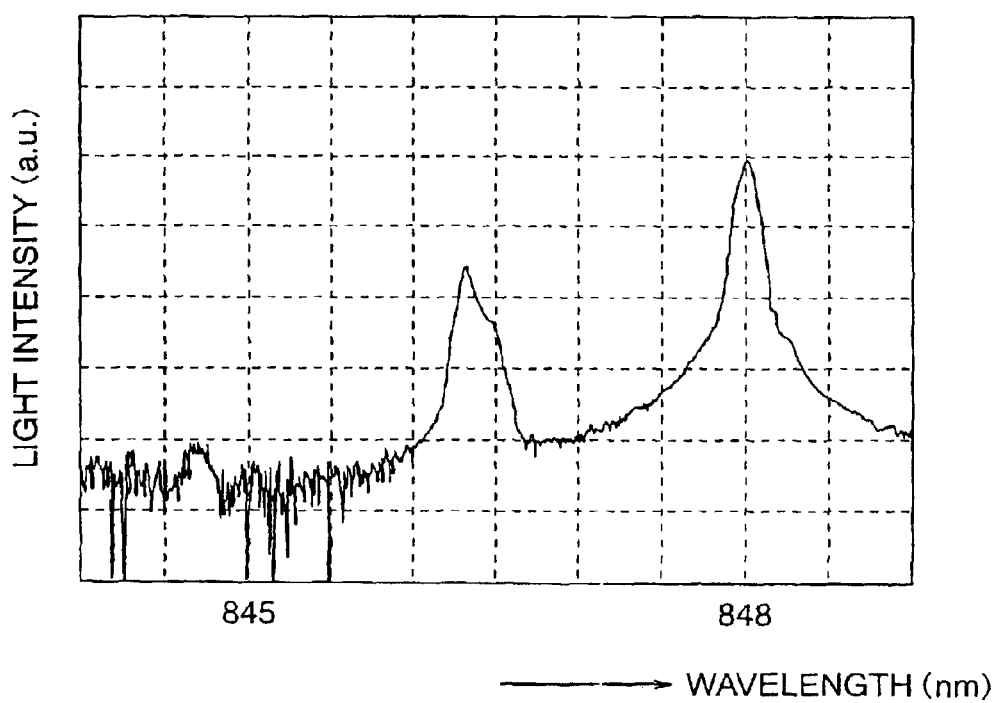

The lasing spectrum of the conventional surface emitting laser device was measured in order to compare the spectrum with that of the surface emitting laser device according to this embodiment. As shown in FIG. 5B, the conventional surface emitting laser device lased in a multi-transverse mode at a higher peak of 848 nm and another lower peak residing between 846 nm and 847 nm.

The cavity length $d_{cav}$ of the conventional surface emitting laser device is set such that the resonant wavelength is 848 nm, similarly to the surface emitting laser device according to this embodiment.

The thickness $d_w$ of the GaAs layer of the quantum well is set so that $\lambda_{PL}$ is 833 nm whereby the peak-gain wavelength generated by injection current is approximately 843 nm.

Since the above embodiments are described only for examples, the present invention is not limited to the above embodiments and various modifications or alterations can be easily made therefrom by those skilled in the art without departing from the scope of the present invention.

What is claimed is:

1. A surface emitting semiconductor laser device comprising:

a substrate;

a pair of semiconductor multilayer reflectors overlying said substrate, a distance and an effective refractive index of a semiconductor material between said pair of semiconductor multilayer reflectors dominating a longitudinal mode wavelength of light that can oscillate between the pair of semiconductor multilayer reflectors;

at least a portion of an active layer sandwiched between said pair of semiconductor multilayer reflectors, said active layer including a quantum well structure that predominantly determines a gain profile spectrum and a gain peak wavelength;

a current confinement layer disposed in a vicinity of said active layer so as to confine an injection current to a predetermined current injection region within said at least a portion of said active layer, wherein said current confinement layer forms an effective refractive index profile in a lateral direction relative to a direction of light output, said effective refractive index profile having a higher refractive index in at least a portion of said predetermined current injection region than outside of said predetermined region in said active layer, said effective refractive index profile dominantly determines a fundamental transverse mode wavelength, and the fundamental transverse mode wavelength being shorter than or equal to the peak-gain wavelength, wherein a wavelength of the laser light output from the laser device is substantially at the fundamental transverse mode wavelength, and is not a multi-mode laser light.

2. The surface emitting semiconductor laser device according to claim 1, wherein the refractive index profile is configured to set the fundamental transverse mode wavelength shorter than or equal to said peak-gain wavelength at a predetermined temperature.

3. The surface semiconductor laser device according to claim 2, wherein said predetermined temperature is an operating temperature of said surface emitting semiconductor laser device.

4. The surface emitting semiconductor laser device according to claim 1, wherein said longitudinal mode wavelength is also determined in accordance with a relationship between a peak emission wavelength obtained by a photoluminescence technique and said quantum wall structure of said active layer and a relationship between said peak emission wavelength and the peak-gain wavelength.

* * * * *